US009736952B2

(12) United States Patent
Kajiwara et al.

(10) Patent No.: US 9,736,952 B2
(45) Date of Patent: Aug. 15, 2017

(54) VEHICLE-MOUNTED ELECTRONIC MODULE

(71) Applicant: Hitachi Automotive Systems, Ltd., Hitachinaka-shi, Ibaraki (JP)

(72) Inventors: Ryoichi Kajiwara, Tokyo (JP); Toshiaki Ishii, Tokyo (JP); Masaru Kamoshida, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 27 days.

(21) Appl. No.: 14/764,001

(22) PCT Filed: Jan. 17, 2014

(86) PCT No.: PCT/JP2014/050729
§ 371 (c)(1),
(2) Date: Jul. 28, 2015

(87) PCT Pub. No.: WO2014/119379
PCT Pub. Date: Aug. 7, 2014

(65) Prior Publication Data
US 2015/0366086 A1    Dec. 17, 2015

(30) Foreign Application Priority Data
Jan. 30, 2013  (JP) .................................. 2013-014919

(51) Int. Cl.
*H05K 5/00* (2006.01)
*H01R 12/72* (2011.01)
(Continued)

(52) U.S. Cl.
CPC ......... *H05K 5/0069* (2013.01); *H01R 12/721* (2013.01); *H05K 1/181* (2013.01);
(Continued)

(58) Field of Classification Search
None
See application file for complete search history.

(56) References Cited

U.S. PATENT DOCUMENTS 5,632,638 A     5/1997  Matsushita et al.
2010/0243638 A1*  9/2010  Niederer ................ H01R 9/091
                                                        219/542

FOREIGN PATENT DOCUMENTS

JP    60-118874 U     8/1985
JP    H077184    *  1/1995
(Continued)

OTHER PUBLICATIONS

International Search Report (PCT/ISA/210) dated Mar. 25, 2014 with English translation (six pages).

*Primary Examiner* — Adrian S Wilson
*Assistant Examiner* — Abhishek Rathod
(74) *Attorney, Agent, or Firm* — Crowell & Moring LLP

(57) ABSTRACT

There is provided an on-vehicle electronic module that includes an external connecting function and environment resistant reliability similar to a previous on-vehicle electronic module and that simultaneously achieves downsizing without a male connector housing component and cost reduction due to reduction of the number of components and assembly man-hours. There are included a circuit board 1 including a mounting region 2 and a terminal forming region 3, and a case housing the mounting region 2 of the circuit board 1. Electronic components 9 and 10 are mounted on the mounting region 2. A board terminal is formed in the terminal forming region 3. The case includes a case member 13 integrally formed with a wall surface and a male connector housing 13a. The wall surface forms a case internal space 21 that houses the mounting region 2. A female connector is mounted to the male connector housing 13a. The circuit board 1 penetrates the case member 13 such that (Continued)

ENLARGED VIEW OF CROSS-SECTION OF THROUGH HOLE the terminal forming region 3 is exposed to a housing space 22 side of the male connector housing 13*a*.

6 Claims, 15 Drawing Sheets

(51) Int. Cl.
| | | |
|---|---|---|
| *H05K 7/20* | (2006.01) | |
| *H05K 1/18* | (2006.01) | |
| *B60R 16/023* | (2006.01) | |
| *H01R 13/504* | (2006.01) | |
| *H01R 13/52* | (2006.01) | |

(52) U.S. Cl.
CPC ........... *H05K 5/006* (2013.01); *H05K 5/0034* (2013.01); *H05K 5/0056* (2013.01); *H05K 7/20454* (2013.01); *H05K 7/20854* (2013.01); *B60R 16/0239* (2013.01); *H01R 13/504* (2013.01); *H01R 13/5202* (2013.01); *H01R 13/5216* (2013.01); *H01R 2201/26* (2013.01)

(56) References Cited

FOREIGN PATENT DOCUMENTS

| | | | |
|---|---|---|---|
| JP | 7-57828 | A | 3/1995 |
| JP | 9-237665 | A | 9/1997 |
| JP | 2002-203614 | A | 7/2002 |
| JP | 2002-525807 | A | 8/2002 |
| JP | 2005038975 | * | 2/2005 |
| JP | 2009-295362 | A | 12/2009 |

* cited by examiner

ENLARGED VIEW OF CROSS-SECTION OF THROUGH HOLE

VEHICLE-MOUNTED ELECTRONIC MODULE

TECHNICAL FIELD

The present invention relates to an on-vehicle electronic module including a circuit board with an electronic component mounted thereon, a case housing the circuit board so as to protect the circuit board from a surrounding environment, and a connector mechanism coupling the circuit board and an external electric circuit.

BACKGROUND ART

As the related art for the technical field, JP 2009-295362 A (PTL 1) and JP 2002-203614 A (PTL 2) are disclosed. PTL 1 describes a box-type electronic module including a circuit board, a connector, a metal base, and a sealing cover, which are integrally formed. The circuit board includes an electronic component mounted thereon. The connector electrically couples the circuit board and an exterior. The metal base includes the circuit board mounted thereon and is bonded to the connector through an adhesive. The sealing cover covers the circuit board and the metal base. The connector includes a required number of metal terminals and a resin housing. The housing includes a socket portion into which a plug of an external harness is inserted and which is substantially parallel to the circuit board, and a terminal holding wall portion holding a metal terminal (refer to claim 1). PTL 2 describes a configuration in which a connector housing is attached to one terminal portion of an FPC harness, and another terminal portion of the FPC harness is coupled on circuit wiring of a mounting board 3 through a conductive adhesive. The connector housing constitutes a part of a connector that electrically couples the circuit wiring formed on the mounting board of an ECU and other circuit wiring. With this configuration, since the connector housing is coupled to the ECU through the FPC harness, the area of a connector housing mounting part on the mounting board of the ECU can be reduced. In addition, since the connector housing is attached to the outside of an ECU body, a height of the mounting board can be lowered and then a height of the entire ECU including a height of the body can be lowered. Therefore, downsizing of the ECU can be achieved.

CITATION LIST

Patent Literature

PTL 1: JP 2009-295362 A
PTL 2: JP 2002-203614 A

SUMMARY OF INVENTION

Technical Problem

An electronic module including a mounting board housed inside a case includes a male connector housing component mounted thereon in order to have a detachable configuration and couple to external wiring. Therefore, a process of electrically coupling the mounting board and a male connector pin is required. A main factor that determines a size of the electronic module is a connector housing mounted and coupled on the circuit board. The connector housing is also another factor that causes an increase in cost with an additional number of components and assembly man-hours. With a configuration in which the connector housing is coupled with an FPC harness while being detached from the electronic module, the height and size of the electronic module itself can be reduced. However, a region for coupling an FPC to the circuit board is required. Therefore, a plane size of the electronic module including the connector housing is still large. The assembly man-hours and the number of components rather increase, resulting in difficulty of cost reduction.

An object of the present invention is to provide an electronic module having an external connecting function and environment resistant reliability similar to a conventional electronic module, and capable of achieving downsizing and cost reduction simultaneously without a male connector housing component.

Solution to Problem

In order to achieve the object described above, an on-vehicle electronic module according to the present invention includes a circuit board and a case. The circuit board includes a mounting region including an electronic component mounted therein, and a terminal forming region including a board terminal formed therein. The case houses the mounting region of the circuit board. The case includes a case member integrally formed with a wall surface and a male connector housing. The wall surfaces form a case internal space that houses the mounting region. A female connector is mounted to the male connector housing. The circuit board penetrates the case member such that the terminal forming region is exposed to a housing space side of the male connector housing.

Advantageous Effects of Invention

According to the present invention, there is provided an electronic module having an external connecting function and environment resistant reliability substantially similar to a conventional electronic module, and capable of achieving downsizing and cost reduction simultaneously without a male connector housing component.

DESCRIPTION OF EMBODIMENTS

Embodiments will be described with reference to the drawings below.

First Embodiment

In the present embodiment, an exemplary electronic module that is disposed inside a vehicular engine room and properly controls engine drive will be described with reference to FIGS. 1 and 2.

Figure 1A:
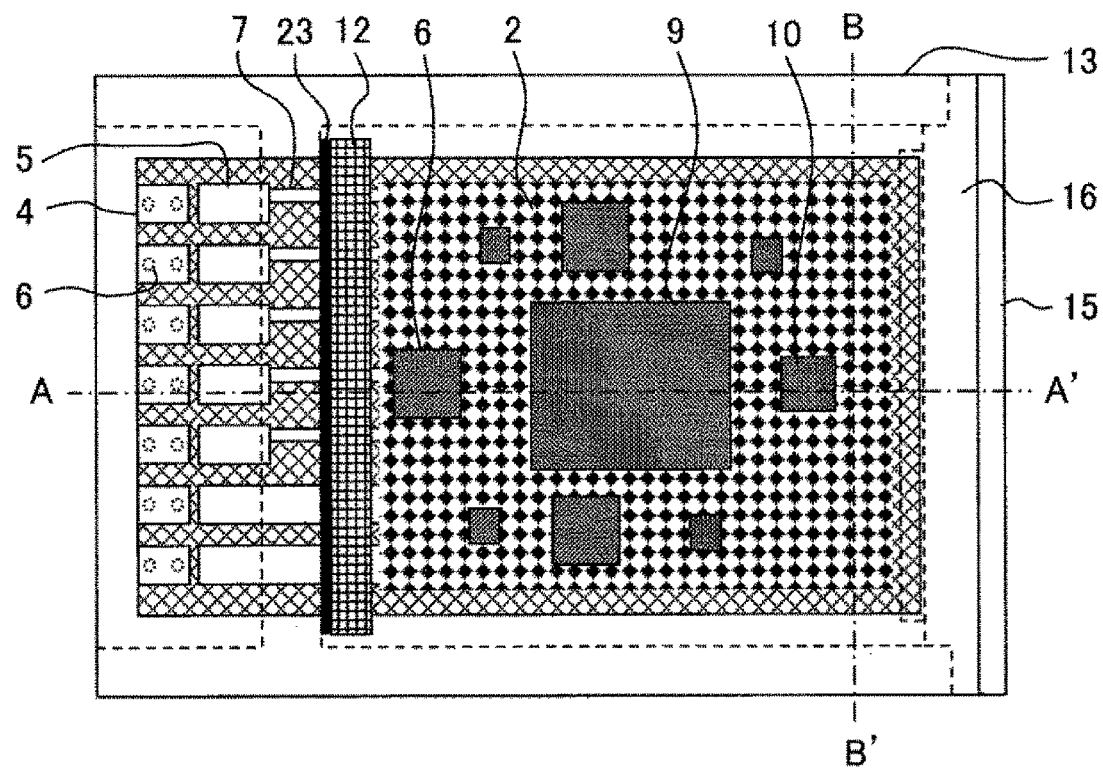
FIG. 1A is a top view of a configuration of an on-vehicle electronic module including an Al die casting (aluminum die casting) member used for a base part that constitutes a part of a case when the case is transparently viewed.
Figure 1B:
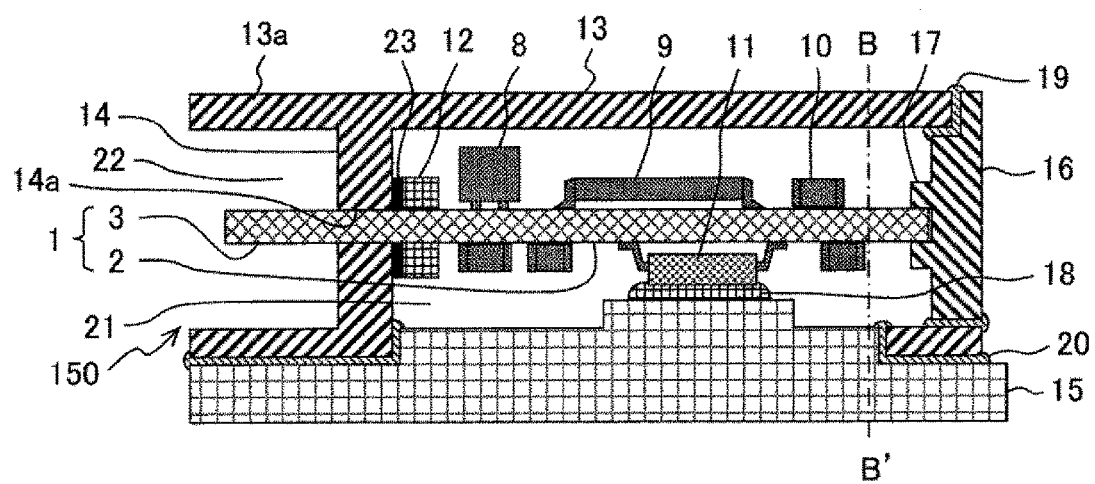
FIG. 1B is a cross-sectional view taken along line A-A' of FIG. 1A.
Figure 1C:
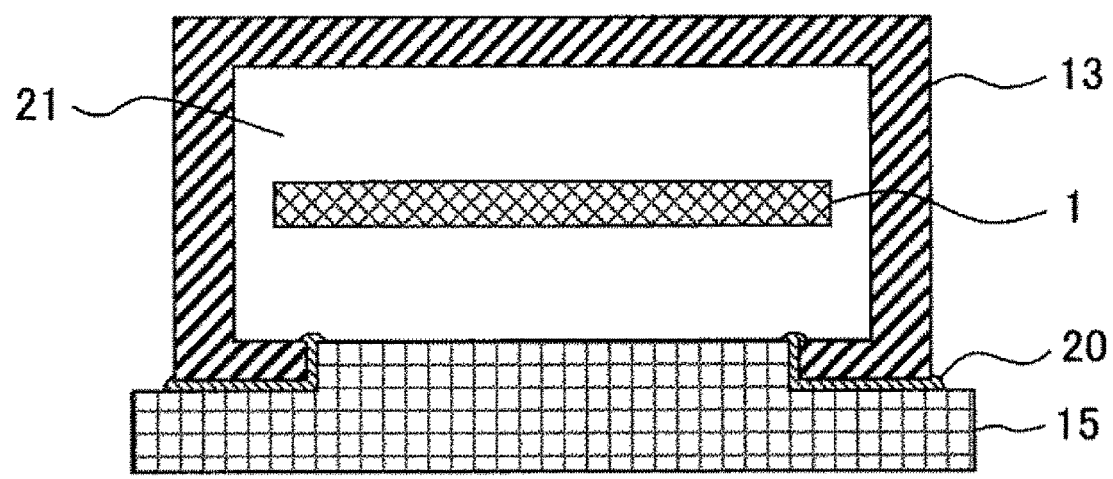
FIG. 1C is a cross-sectional view taken along line B-B' of FIG. 1A.

FIG. 1A is a top view of a configuration of an on-vehicle electronic module including an Al die casting (aluminum die casting) member used for a base part that constitutes a part of a case when the case is transparently viewed. FIG. 1B is a cross-sectional view taken along line A-A' of FIG. 1A. FIG. 1C is a cross-sectional view taken along line B-B' of FIG. 1A.

In the figures, a circuit board 1 is divided into a terminal forming region 3 and a mounting region 2 including electronic components 8 to 11 mounted thereon. An insulating resin member 12 is formed between the terminal forming region 3 and the mounting region 2 so as to surround a circumference of the circuit board 1. Formation of the insulating resin member 12 on the circuit board 1 can be achieved by any of the following methods: a method of bonding bisected insulating resin members and the circuit board 1 with an adhesive after the bisected insulating resin members interpose and press the circuit board 1; a method of forming a thermosetting resin, such as an epoxy resin or a phenol resin by transfer molding after the circuit board 1 is set to a metal die including a cavity formed in a region of the insulating resin member 12; or a method of molding a thermoplastic resin, such as polybutylene terephthalate, nylon, or polyphenylene sulfide by injection molding. The insulating resin member 12 is formed before the electronic components 8 to 11 are mounted on the circuit board 1.

The electronic components 8 to 11 are mounted on the circuit board 1 by printing and coating adhesive lead-free soldering paste on predetermined wiring, mounting the electronic components 8 to 11 on the paste on the wiring, and performing reflow soldering under a nitrogen atmosphere in a conveyor furnace. After the soldering, a flux component is washed and removed.

A resin case member 13 is manufactured by injection molding of a thermoplastic resin. A metal die for the injection molding includes three members, i.e., a metal die member forming an outer circumference of the case and a connector housing space 22, a metal die member forming a case internal space 21, and a metal die member forming an opening of a belly part to be fitted with an Al die casting case member (hereinafter referred to as Al die casting member) 15. Regarding assembly, the Al die casting member 15 and the resin case member 13 are integrally formed with an adhesive 20 so as to form a bag shape without a rear wall. Next, the circuit board 1 including the electronic components 8 to 11 mounted thereon is inserted, from the rear, into the case so as to protrude the terminal forming region 3 from an opening 14a of a front partition wall 14 to the outside of the case (to the connector housing space 22). In this case, the insulating resin member 12 is pressed to the front partition wall 14 so as to position board terminals (an outer terminal 4 and an inner terminal 5) formed in the terminal forming region 3 at predetermined positions of the connector housing space 22. After that, the front partition wall 14 and the insulating resin member 12 are bonded with an adhesive 23. The front partition wall 14 and the resin case member 13 are integrally formed so that the front partition wall 14 serves as a partition wall separating the case internal space 21 of the resin case member 13 and the connector housing space 22 from each other.

Next, heat conductive paste 18 with high viscosity is supplied, by a dispenser, to between the Al die casting member 15 and the electronic component 11 generating a large amount of heat, and then is gelated by low temperature heat treatment. Finally, a resin lid 16 including a rear guide 17 is pushed from the rear, and then bonded to the resin case member 13 with an adhesive 19. The rear guide 17 has a configuration of holding and supporting a rear end of the circuit board 1. The adhesive 19 fills a gap between the lid 16 and the resin case member 13 so as to seal the inside of the case formed of the resin case member 13. A terminal pattern of the circuit board 1 includes the outer terminal 4 and the inner terminal 5 arranged in two rows on a board end surface side. The outer terminal 4 is coupled to inner wiring via a through hole 6. The inner terminal 5 is coupled to surface wiring 7. The terminal forming region 3 and the connector housing space 22 constitute a male connector 150. The terminal forming region 3 includes the outer terminal 4 and the inner terminal 5 formed therein. The connector housing space 22 is formed by a part of the case member 13. The inner wiring is not shown in FIG. 1, but inner wiring is disposed like, for example, inner wiring 52 in FIG. 5.

Figure 2:
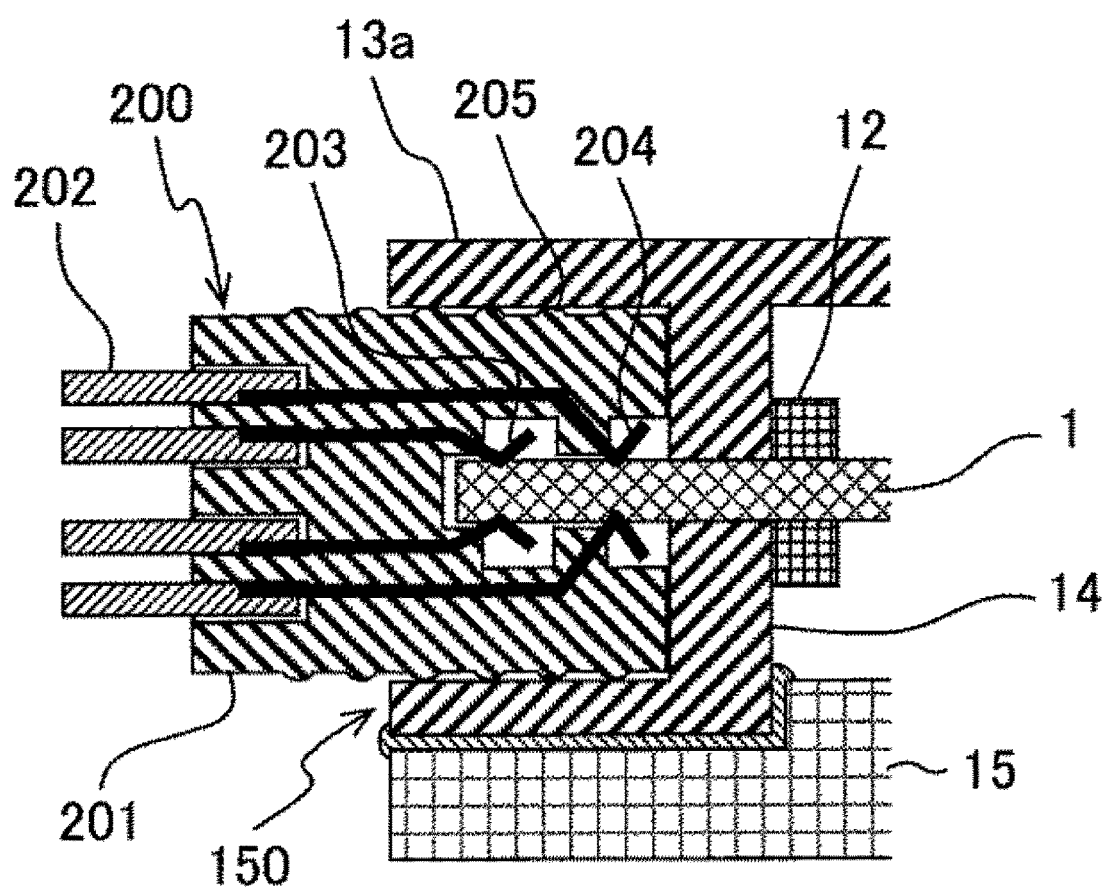
FIG. 2 is a cross-sectional view of a client-side connector coupled to an on-vehicle electronic module.

FIG. 2 is a cross-sectional view of the male connector 150 of the electronic module in FIG. 1 mounted with a client-side female connector 200. The female connector 200 includes a connector pin 203 and another connector pin 204. The connector pin 203 contacts the outer terminal 4 of the circuit board 1 so as to obtain conduction. The connector pin 204 contacts the inner terminal 5 so as to obtain conduction. The female connector 200 is coupled to a wire harness 202 by calking or solder joint at a post-stage. A female connector case 201 is inserted and mounted into a male connector housing 13a. The female connector 200 is in close contact with the male connector housing 13a without any gap by projections 205 for acquiring airtightness formed on the female connector 200. When the female connector 200 is inserted, by the connector pins 203 and 204, frictional force in the right direction in FIG. 2 is applied to the terminal forming region 3 through the board terminals (the outer terminal 4 and the inner terminal 5). However, since the insulating resin member 12 bonded to the partition wall 14 supports the force applied to the board terminals, the mounting region 2 of the circuit board 1 is not affected by the force.

As described above, in this embodiment, the case housing the circuit board 1 with the electronic components mounted thereon includes the case member (resin case) 13. The case member 13 includes the wall surfaces and the male connector housing 13a integrally formed. The wall surfaces form the case internal space that houses the mounting region 2. The male connector housing 13a is to be mounted with the female connector 200. In addition, the circuit board 1 penetrates the case member 13 such that the terminal forming region 3 is exposed to the housing space 22 of the male connector housing 13a.

The circuit board 1 integrally includes the insulating resin member between the mounting region 2 and the terminal forming region 3. The insulating resin member fixes the circuit board 1 to the case member 13. The case member 13 includes the wall surfaces and the male connector housing 13a integrally formed and a partition wall 14. The wall surfaces form the case internal space 21 that houses the mounting region 2. The male connector housing 13a is to be mounted with the female connector 200. The partition wall 14 separates the case internal space 21 and the housing space 22 of the male connector housing 13a.

The case member 13 includes a resin member that has an opposing surface to the partition wall 14 open. The case includes the case member 13 and a resin lid member 16. The lid member 16 is embedded into the open surface of the case member 13 facing the partition wall 14.

According to the present embodiment, the client female connector 200 can be coupled to the male connector housing 13a that includes a part of the case (a part of the resin case member 13 in the present embodiment) and the terminals of the circuit board 1. Therefore, a conventional male connector housing component can be omitted. In addition, reduction of the number of components and omission of a solder joint process of a circuit board and a connector pin can reduce manufacturing cost. Since a connector housing, which is the largest component to be disposed on the board, is omitted, a connector pin connecting area on the circuit board is not required and a board size and a module height can be reduced. In the case, a rear (an edge portion on the opposite side of the connector housing 13a) opening is hermetically sealed with the resin lid 16 and the adhesive 19. The opening 14a through which the board terminals 4 and 5 protrude is also hermetically sealed with the insulating resin member 12 formed on the circuit board 1 and an adhesive 23. Therefore, the case internal space is completely blocked from an exterior of the case. As a result, the circuit board 1 including the electronic components 8 to 11 mounted thereon is protected from a surrounding environment, such as moisture, a corrosive gas, or dust. In particular, since the insulating resin member 12 widely secures a contact area with the partition wall 14 around the opening 14a, sealing performance with the adhesive 23 can be improved. The client female connector 200 is fitted in close contact with the connector housing 13a formed of a part of the case. Thus, the connector space 22 into which the terminals 4 and 5 protrude is also completely blocked from the exterior. Therefore, contact portions between the terminal 4 and the connector pin 203 and between the terminal 5 and the connector pin 204 are protected from the surrounding environment. Accordingly, excellent long-term reliability can be achieved. The control electronic component 11 generating a large amount of heat is disposed on a board surface on the side of the Al die casting member 15 of the circuit board 1. A space on the electronic component 11 is filled with a soft gel insulating resin having excellent heat conductivity. Therefore, heat radiation of the electronic component 11 is improved so as to inhibit a temperature rise and thermal fatigue of a soldering portion of the electronic components. Accordingly, the electronic module with excellent long-term reliability can be provided.

In this embodiment, the Al die casting member 15 and the resin case member 13 are bonded with the adhesive 20 and integrally formed. Alternatively, the following two methods can be used to integrally form the Al die casting member 15 and the resin case member 13. A first method is that the resin case member 13 is welded to the Al die casting member 15 with a thermoplastic resin by heating. A second method is a combined method that combines the first method with an anchor effect acquired by welding after a fitting configuration is formed on the Al die casting member 15.

In order to form the insulating resin member 12, a through hole 39 (refer to FIGS. 3A and 3B) may be disposed in the circuit board 1 and then resin for constituting the insulating resin member 12 may be filled in the through hole 39 as in a second embodiment to be described later.

With respect to a width of the circuit board 1, a width of the mounting region 2 may be wider than a width of the terminal forming region 3 as in the second embodiment to be described later. The width of the board at the mounting region 2 may be wider than a width of the insulating resin member 12. In this case, side surface guides 42 (refer to FIG. 3C) may be disposed on left and right side walls of the resin case member 13 so as to hold and fix side portions of the circuit board 1 protruding in left and right directions from the insulating resin member 12.

Figure 4A:
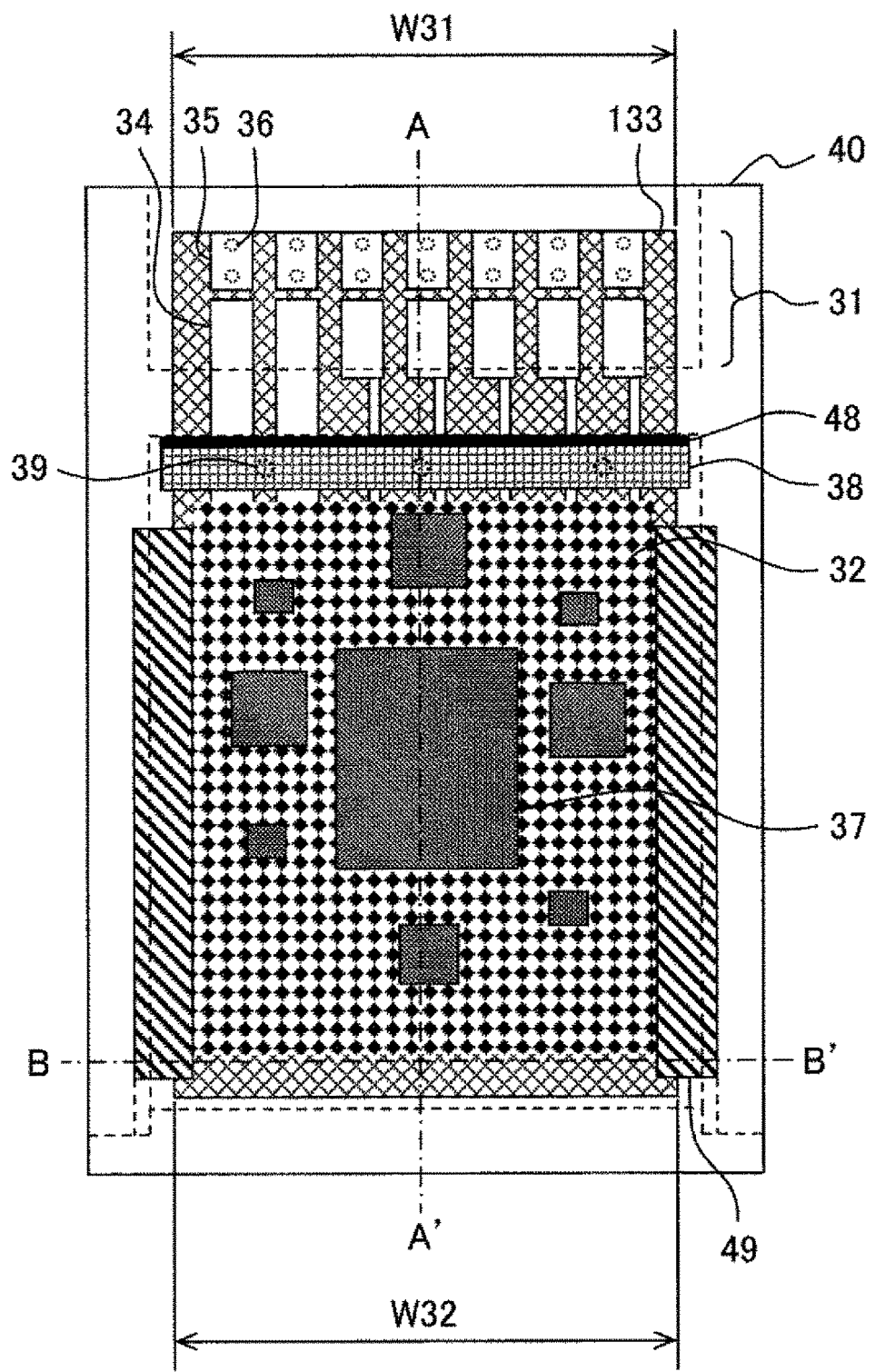
FIG. 4A is a top view of a configuration of an on-vehicle electronic module including a circuit board attached to a case by using a board holding auxiliary guide when the case is transparently viewed.
Figure 4B:
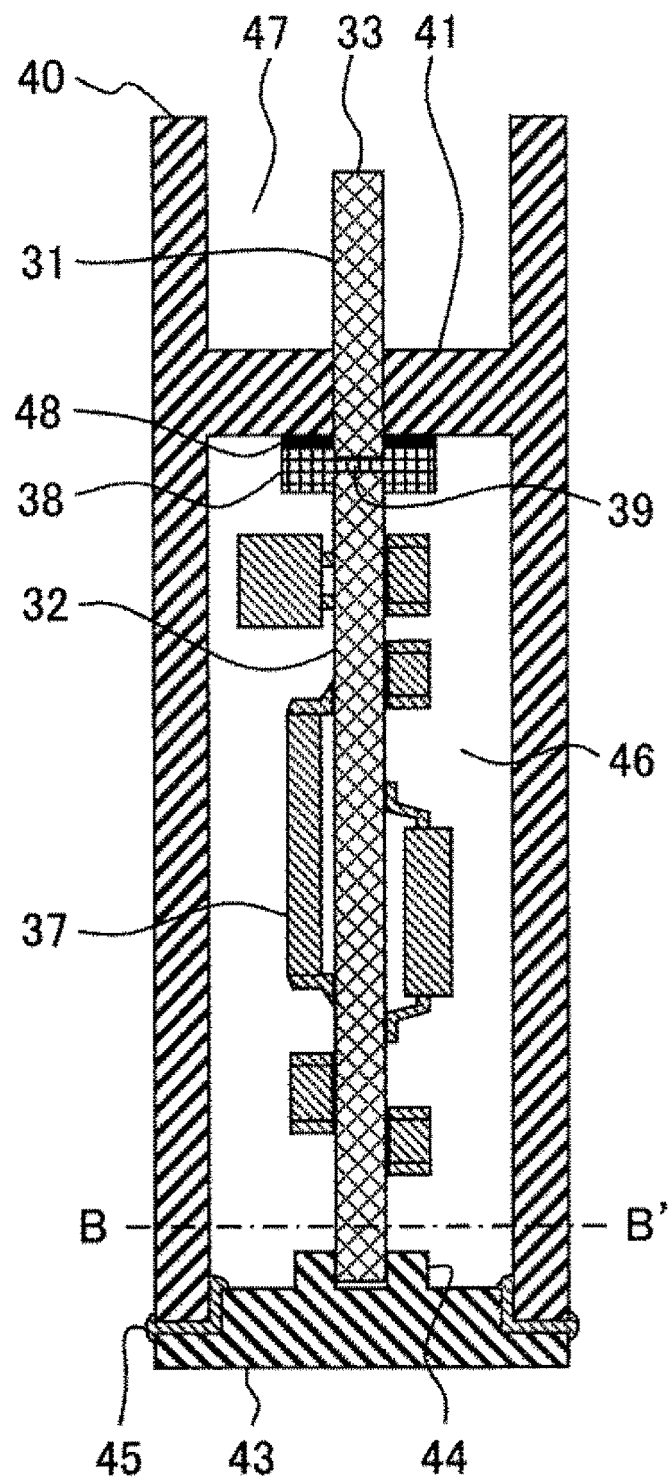
FIG. 4B is a cross-sectional view taken along line A-A' of FIG. 4A.
Figure 4C:
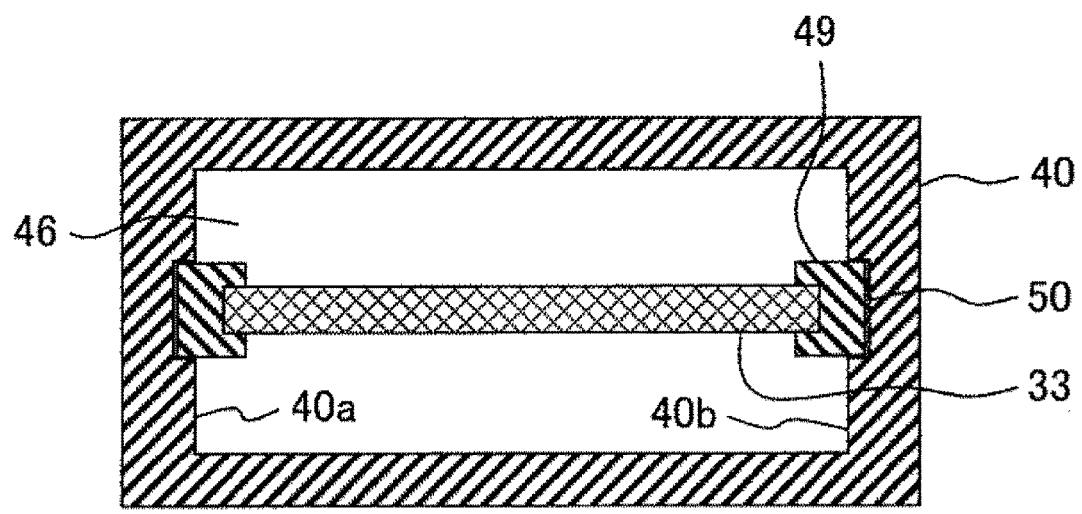
FIG. 4C is a cross-sectional view taken along line B-B' of FIG. 4A.

In configurations of FIGS. 4A, 4B, and 4C in the second embodiment to be described later, a configuration including a board holding auxiliary guide 49 and a groove 50 disposed on a side wall of a resin case 40 may be applied to this embodiment. In the configurations of FIGS. 4A, 4B, and 4C in the second embodiment to be described later, a width relationship between a circuit board 133 and an insulating resin member 38 is substantially the same as in this embodiment. Accordingly, as in FIGS. 4A, 4B, and 4C, grooves 50 are disposed in the resin case member 13 so that the circuit board 1 can be held inside the resin case member 13 by board holding auxiliary guides 49.

Second Embodiment

In the present embodiment, an engine control electronic module that achieves downsizing, weight saving, and cost reduction by omitting a metal member, will be described with reference to FIGS. 3A, 3B, 4A, 4B, and 4C.

Figure 3A:
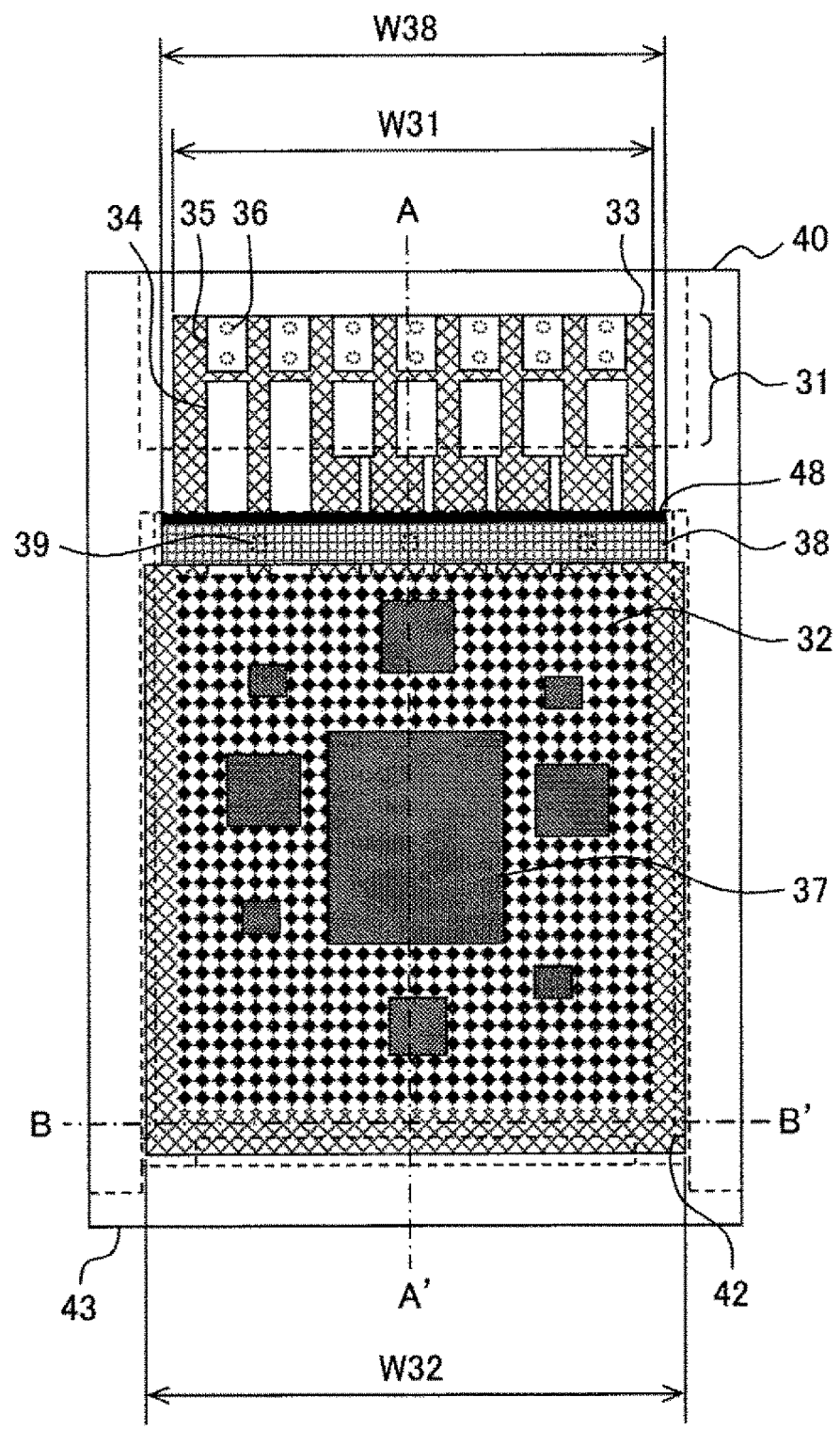
FIG. 3A is a top view of a configuration of an on-vehicle electronic module including a case all made of resin when the case is transparently viewed.
Figure 3B:
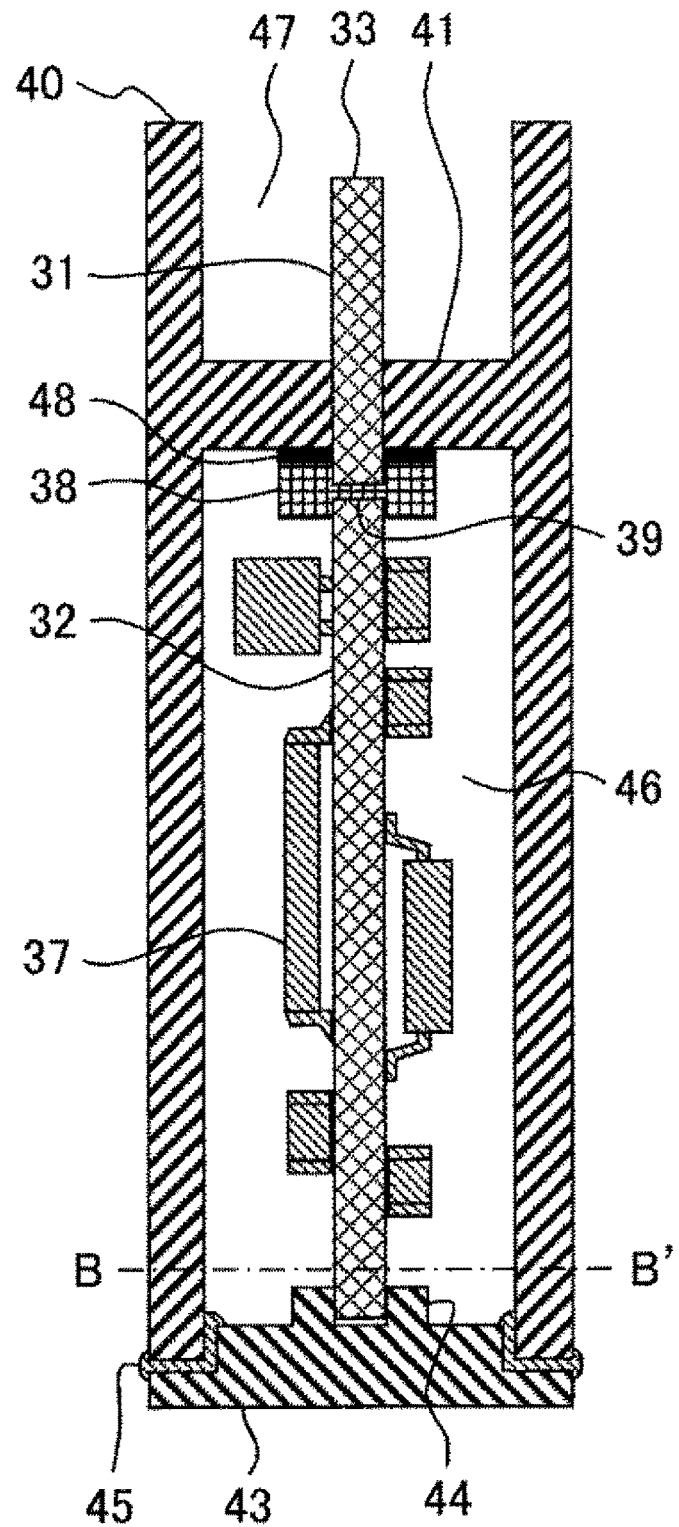
FIG. 3B is a cross-sectional view taken along line A-A' of FIG. 3A.
Figure 3C:
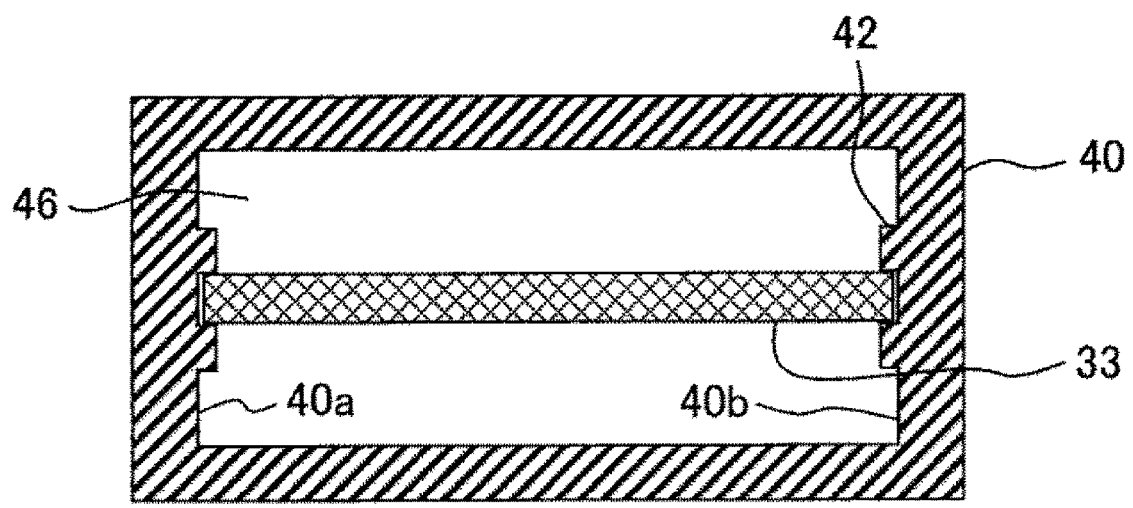
FIG. 3C is a cross-sectional view taken along line B-B' of FIG. 3A.

FIG. 3A is a top view of a configuration of an on-vehicle electronic module including a case made of only resin when the case is transparently viewed. FIG. 3B is a cross-sectional view taken along line A-A' of FIG. 3A. FIG. 3C is a cross-sectional view taken along line B-B' of FIG. 3A.

In the figures, a circuit board 33 includes a terminal forming region 31 and a mounting region 32 including an electronic component 37 mounted thereon. An insulating resin member 38 is formed on a boundary between the terminal forming region 31 and the mounting region 32 while filling a board through hole 39. With respect to a width of the circuit board 33, a width W32 of the mounting region 32 is wider than a width W31 of the terminal forming region 31. The insulating resin member 38 is formed over a full periphery of the board of the terminal forming region 31. The width W32 of the board at the mounting region 32 is wider than a width W38 of the insulating resin member 38. Side surface guides 42 are disposed on left and right side walls 40a and 40b in a case internal space 46 of a resin case member 40 so as to hold and fix side portions of the circuit board 33 protruding in left and right directions from the insulating resin member 38. The side surface guides 42 are formed from a partition wall 41 to before a part to be fitted with a rear lid 43. Since the resin case member 40 is manufactured by injection molding, the resin case member 40 has no recessed part from an opening of a connector housing space 47 to the inner partition wall 41 and from an opening of the case internal space 46 to the inner partition wall 41. As a result, a metal die can be removed after the injection molding. The lid 43 sealing inside the case 40 and a terminal pattern of the terminal forming region 31 are substantially the same as in FIG. 1. In addition, a method of mounting an electronic component on the circuit board is substantially the same as in FIG. 1. Therefore, the descriptions are omitted herein. Reference numerals 34, 35, and 36 respectively denote an inner terminal, an outer terminal, and a Cu (copper)-plated through hole electrically coupling inner wiring and the outer terminal.

According to this embodiment, as in FIG. 1, a client female connector can be electrically coupled without a conventional male connector housing component. Therefore, reduction of the number of components and omission of a solder joint process of a circuit board and a connector pin can reduce manufacturing cost and a height of a module. Since four edges of the circuit board 33 are held, deformation of the board caused by heat and stress can be inhibited. As a result, a highly reliable electronic module resistant to vibration and impact can be provided. Heat radiation of an electronic component generating a large amount of heat in the electronic module is degraded when compared with an electronic module having an Al die casting member 15. On the other hand, there is an advantage of achieving further downsizing and weight saving by omission of the Al die casting member 15. With respect to the heat radiation, a countermeasure against heat can be achieved by the following methods: a method of embedding a metal member in case resin upon injection molding; a method of radiating heat from a connector portion by using board wiring; or a method of coating a material with a high radiation coefficient on a surface of a mounting board inside the case or a case internal wall.

An example of a case member made of only resin as in FIG. 2 and a modified holding configuration of a side surface of a circuit board, will be described with reference to FIGS. 4A, 4B, and 4C. FIG. 4A is a top view of a configuration of an on-vehicle electronic module when a case is transparently viewed. FIG. 4B is a cross-sectional view taken along line A-A' of FIG. 4A. FIG. 4C is a cross-sectional view taken along line B-B' of FIG. 4A. Here, only different parts from the parts in FIG. 2 will be described in detail.

In a circuit board 133 in the figures, a board width W31 of a terminal forming region 31 and a board width W32 of a mounting region 32 are substantially the same. A board holding auxiliary guide 49 is attached to a side surface of the board of the mounting region 32 so as to interpose the board 133 and fit to a groove 50 disposed on each of left and right side walls 40a and 40b of a resin case member 40.

According to the present embodiment, even when the width of the board 133 is smaller than a width of an insulating resin member 38 and an assembly method of inserting the circuit board 133 from a rear opening of the resin case 40 is applied, the board 133 can be fixed on the side walls of the resin case via the board holding auxiliary guides 49. Therefore, a size of an expensive board can be reduced and cost reduction for the electronic module can be achieved. No problem associated with assembly occurs by a procedure of attaching the board holding auxiliary guides 49 to a mounting board after completion of the mounting board, and then inserting the mounting board into the resin case member 40.

Third Embodiment

Figure 5:
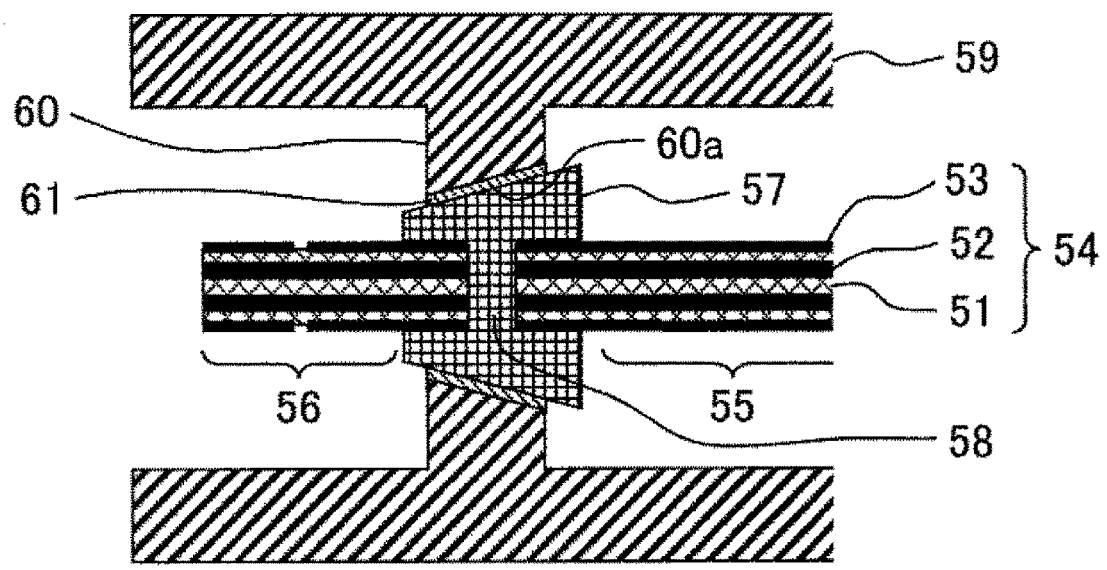
FIG. 5 is a view of an exemplary configuration of connection between an insulating resin member formed on a circuit board and a case.
Figure 6:
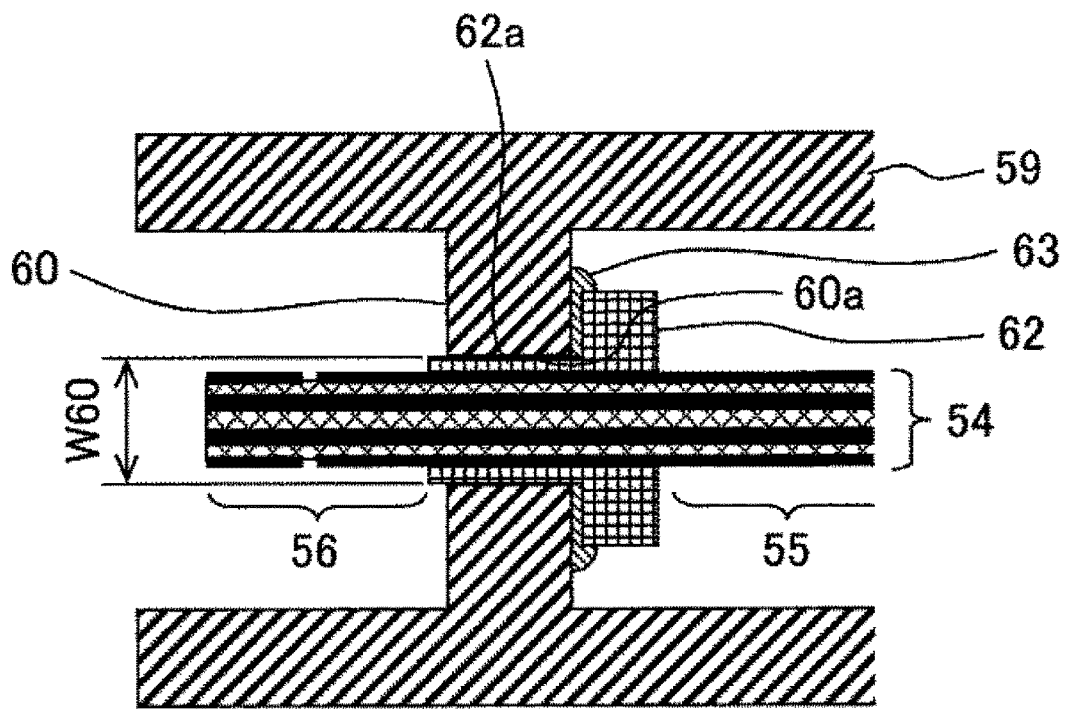
FIG. 6 is a view of another exemplary configuration of connection between an insulating resin member formed on a circuit board and a case.
Figure 7:
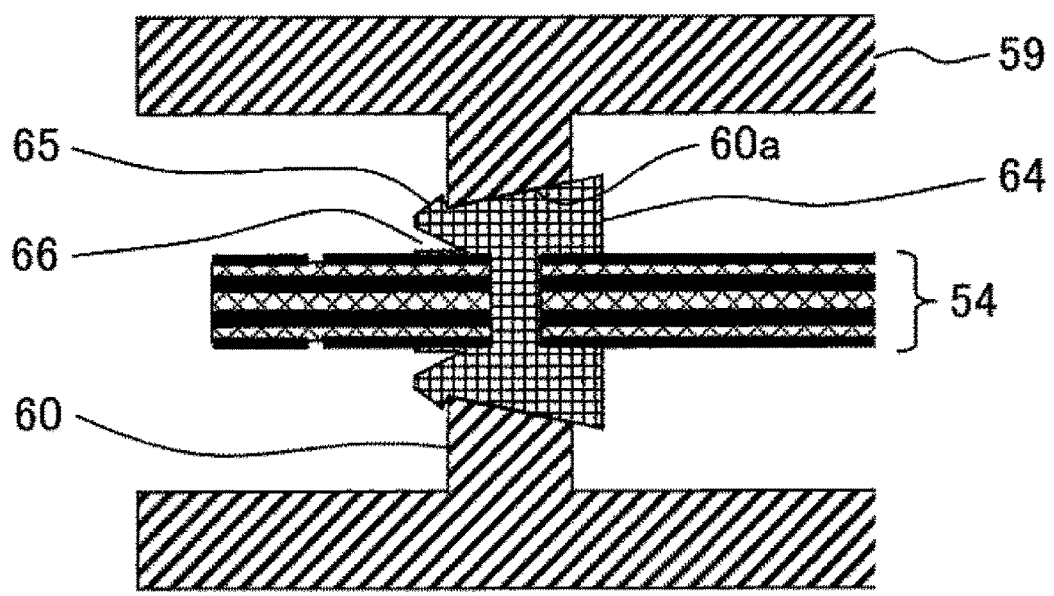
FIG. 7 is a view of still another exemplary configuration of connection between an insulating resin member formed on a circuit board and a case.
Figure 8A:
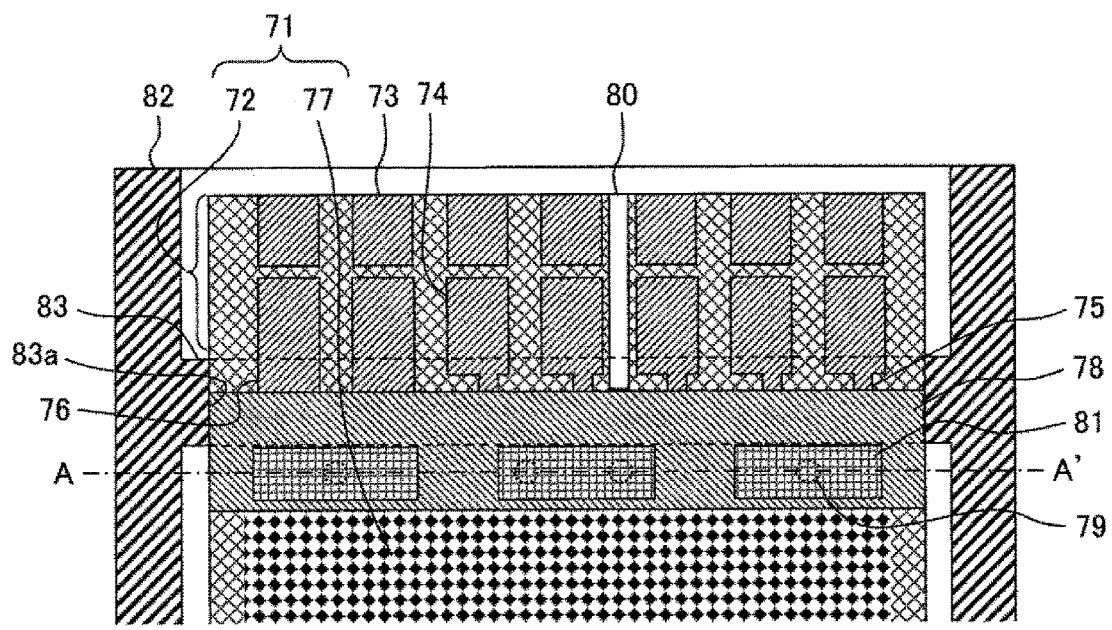
FIG. 8A is a top view of a configuration of an on-vehicle electronic module including an insulating resin member, to be formed on a circuit board, divided in a width direction of the circuit board when a case is transparently viewed.
Figure 8B:
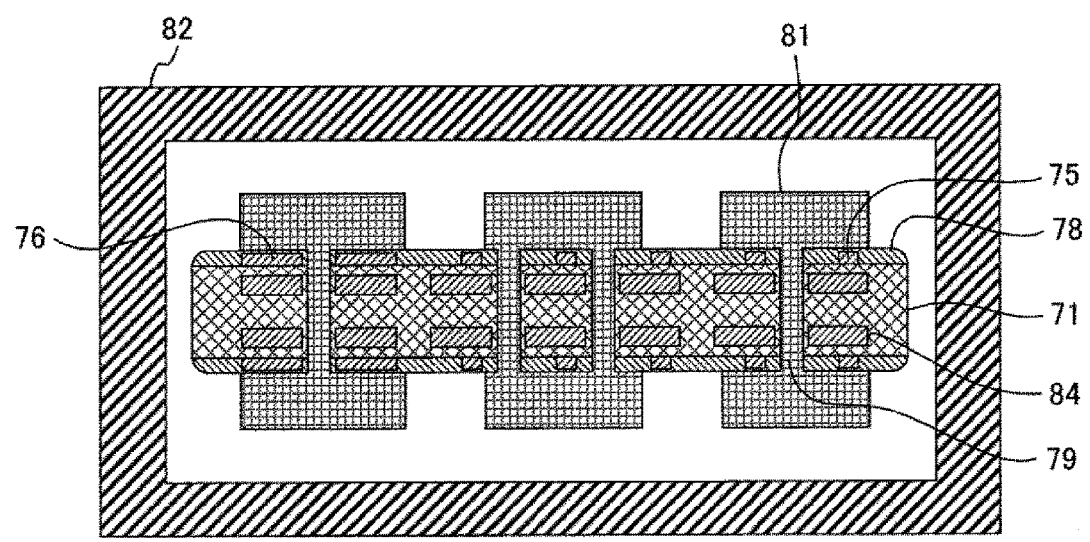
FIG. 8B is a cross-sectional view taken along line A-A' of FIG. 8A.

An exemplary configuration of an insulating resin member that fixes a circuit board terminal to a partition wall of a resin case with the circuit board terminal protruding from the partition wall to a connector housing space, will be described with reference to FIGS. 5, 6, 7, 8A, and 8B. FIGS. 5, 6, and 7 are views of exemplary configurations coupling an insulating resin member formed on a board and a case. FIG. 8A is a top view of a configuration of an on-vehicle electronic module including an insulating resin member, to be formed on a circuit board, divided in a width direction of the circuit board when a case is transparently viewed. FIG. 8B is a cross-sectional view taken along line A-A' of FIG. 8A. Note that the configurations of the insulating resin member to be described in this embodiment may be applied to the first and second embodiments.

FIG. 5 is an exemplary configuration of an insulating resin member 57 having a tapered shape. In the figure, a circuit board 54 is divided into a terminal forming region 56 and a mounting region 55 to be mounted with an electronic component, and includes an insulating board 51, inner wiring 52, and surface wiring 53. The insulating resin member 57 is formed between the terminal forming region 56 and the mounting region 55 of the circuit board 54 so as to be over a full periphery of the board. The insulating resin member 57 has a tapered cross section. A plurality of through holes 58 is formed in a region including the insulating resin member 57 and no wiring 52 and 53 formed therein, while being filled with insulating resin of the insulating resin member 57. The plurality of through holes 58 couples the insulating resin members 57 on both surfaces of the board. A resin case member 59 is separated by a partition wall 60 that separates a connector housing space and a case internal space from each other. An opening 60a having substantially the same angle as the tapered shape of the insulating resin member 57 is formed in the partition wall 60. The insulating resin member 57 and the opening 60a of the partition wall 60 are firmly bonded with a seal adhesive 61.

According to the present embodiment, positioning of the circuit board 54 can be achieved by a tapered shape effect of the insulating resin member 57 caused by pressing the circuit board 54 to the partition wall 60. Assembly with high-precision positioning of the board terminal can be achieved. In addition, contraction force of the insulating resin member 57 formed in a through hole 58 portion can retain close contact between the board 54 and the insulating resin member 57 over a long period. Therefore, excellent airtightness of an interface between the board 54 and the insulating resin member 57 can be maintained over a long period. Furthermore, by the seal adhesive, excellent airtightness of an interface between the insulating resin member 57 and the opening 60a can be retained over a long period. Securing the airtightness of these configurations prevents outside air from intruding into the inside of the case. Therefore, the electronic module having excellent environment resistance can be provided.

FIG. 6 is a view of an exemplary configuration of an insulating resin member 62 having a flange shape. In the figure, a size of the insulating resin member 62 on the side of a mounting region 55 is larger than a width W60 of an opening of a partition wall 60. Another size of the insulating resin member 62 on the side of a terminal forming region 56 is substantially the same as or less than the width W60 of the opening. An adhesive 63 is formed so as to hermetically seal and fix an interface between the thick insulating resin member 62 and the partition 60. In an assembly process, certain clearance is disposed between a thin portion 62a of the insulating resin member 62 and an opening 60a of the partition wall 60 in order to facilitate insertion work. This results in difficulty of accurate positioning. Accordingly, upon the assembly, the circuit board 54 is positioned on a connector housing side using a jig including a board terminal insertion opening like a client female connector. Then, an adhesive 63 is subjected to curing treatment and the assembly is performed.

FIG. 7 is a view of an exemplary configuration of an insulating resin member 64 fixed to a partition wall 60 without an adhesive. In the figure, an escape space 66 is formed on a board 54 side of a tip portion of the insulating resin member 64 having a tapered shape. A claw 65 is formed on an outer side of the tip portion. A tapered shape that has the same shape as the tapered shape of the insulating resin member 64 is provided at an opening 60a of the partition wall 60. An opening size on a connector housing side of the opening 60a is smaller than a claw size of the insulating resin member 64. When the insulating resin member 64 is pressed into the opening 60a of the partition wall 60 and the claw 65 passes through the partition wall 60, the claw 65 is bent and deformed to the escape space 66 on the board side. After passing through the partition wall 60, the bend of the claw 65 is released and the claw 65 returns to an original position. As a result, the insulating resin member 64 is locked by the claw 65 serving as a stopper.

According to the present embodiment, the insulating resin member 64 can be fixed to the partition wall 60 without an adhesive. As a result, curing treatment for the adhesive is omitted. Therefore, assembly time can be shortened, and thereby manufacturing cost can be reduced. Airtightness of an interface between the opening 60a and the insulating resin member 64 is not so high. However, a connector space is blocked from the exterior. Therefore, no problem of environment resistance occurs.

FIGS. 8A and 8B are views of exemplary configurations of insulating resin members 81 intermittently formed on a circuit board 71. In the figures, between a terminal forming region 72 and an electronic component mounting region 77 of the circuit board 71, insulating resin having a thickness substantially equal to or more than a height of surface wiring 75 and 76 is printed, coated, and subjected to curing treatment so that a flattened surface region 78 is formed. The intermittent insulating resin members 81 are formed on the flattened insulating resin layer 78. With respect to each insulating resin member 81, insulating resin members 81 on both surfaces of the board are coupled to each other with insulating resin filled in at least one board through hole 79. An opening 83a of a partition wall 83 is formed so that the terminal forming region 72 of the board 71 passes through the opening 83a. The insulating resin member 81 is fixed to the partition wall 83 with an adhesive. A slit 80 is formed in the terminal forming region 72 of the board 71 in order to facilitate positioning in response to a client female connector. Reference numerals 73, 74, 84, and 82 denote an outer terminal, an inner terminal, inner wiring, and a resin case member, respectively.

According to the embodiment in FIGS. 5, 6, 7, 8A, and 8B, configurations that prevent stress load caused by connector insertion from transmitting to the electronic component mounting region 77 of the circuit board 71, can be achieved. Therefore, the configurations prevent deformation of the board 71 and improve reliability of a solder joint portion. Furthermore, according to the embodiment in FIGS. 8A and 8B, since the region for forming the insulating resin member 81 is flattened by an insulating resin layer, such as solder resist, forming the insulating resin member 81 by transfer molding of a thermosetting resin is effective. In the present embodiment, a gap on an interface caused by pressing a metal die to the circuit board can be restricted to a few μm or less, preventing a mold resin from flowing out of the gap. As a result, the insulating resin member 81 having no burr can be formed. In addition, even when interface strength between the individualized insulating resin member 81 and the insulating resin layer 78 and other interface strength between the insulating resin layer 78 and the circuit board 71 are small, since the insulating resin members 81 on both surfaces of the board are integrally formed through the insulating resin formed in the through hole 79, the insulating resin member 81 is not peeled off from the circuit board 71. Therefore, the electronic module having excellent initial yield and long-term reliability can be provided.

It is needless to say that the insulating resin layer 78 according to the present embodiment is applicable to the other embodiments. In the other embodiments, when the insulating resin members 12, 38, 57, 62, 64, 133, and the like are formed by transfer molding of a thermosetting resin, forming the insulating resin layer 78 can prevent a mold resin from flowing out.

Fourth Embodiment

In the present embodiment, an exemplary engine control electronic module that can be miniaturized even with a large number of terminals, will be described with reference to FIGS. 9A and 9B.

Figure 9A:
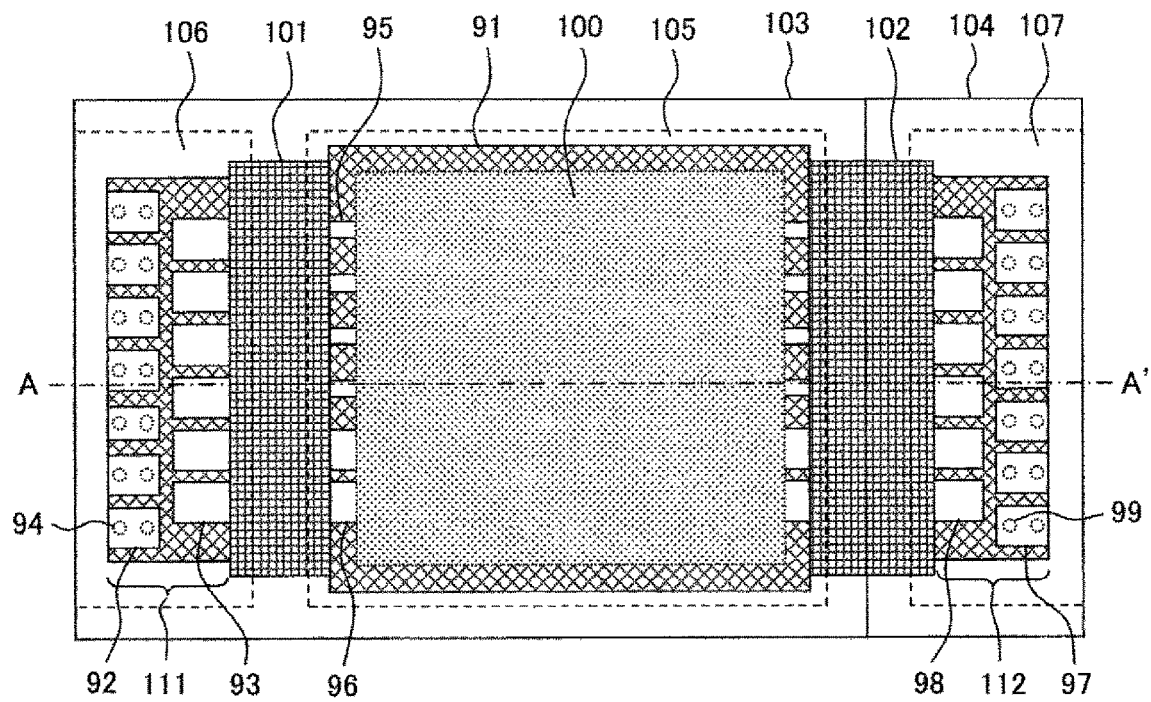
FIG. 9A is a top view of a configuration of an on-vehicle electronic module including connector structures on two opposing sides of a resin case when the case is transparently viewed.
Figure 9B:
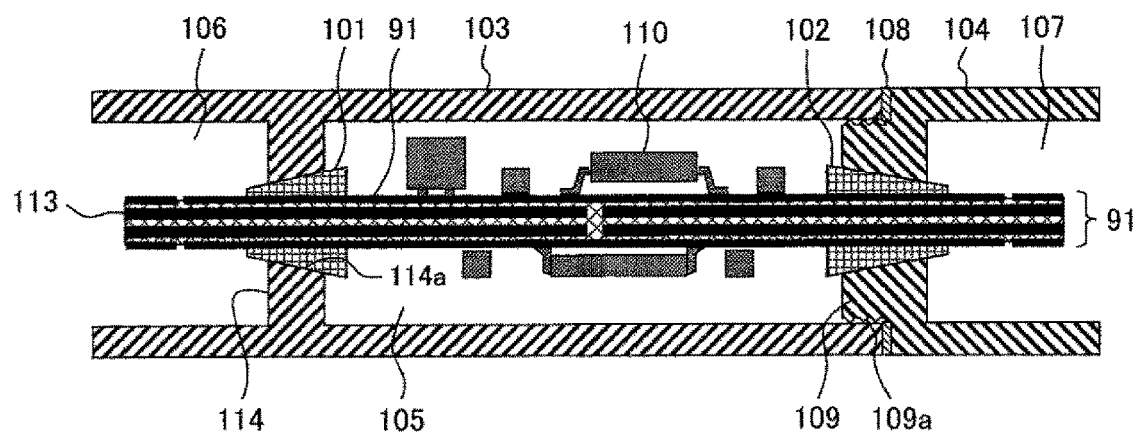
FIG. 9B is a cross-sectional view taken along line A-A' of FIG. 9A.

FIG. 9A is a top view of a configuration of an electronic module in which a female connector to be coupled to a harness is connectable to each of two sides of a resin case when the case is transparently viewed. FIG. 9B is a cross-sectional view taken along line A-A' of FIG. 9A. In the figures, a circuit board 91 includes terminal forming regions 111 and 112 and a mounting region 100 including an electronic component 110 mounted thereon. Insulating resin members 101 and 102 are respectively formed, by transfer molding of a thermosetting resin, between the terminal forming region 111 and the mounting region 100 and between the terminal forming region 112 and the mounting region 100. Although not shown in the figures, a circuit board surface around a mold is subjected to planarization treatment by an insulating resin, such as resist, as in the third embodiment in order to prevent a mold resin from leaking due to unevenness caused by surface wiring.

With respect to a width of the circuit board 91, the mounting region 100 is wider than the terminal forming regions 111 and 112. A width of the mounting region 100 is set to be wider than widths of the insulating resin members 101 and 102. The insulating resin members 101 and 102 have tapered shapes gradually thinned toward an outer side. Terminal patterns in the terminal forming regions 111 and 112 include outer terminals 92 and 97 and inner terminals 93 and 98 arranged in a zigzag pattern. The outer terminals 92 and 97 are coupled to inner wiring 113 via Cu-plated through holes 94 and 99.

A resin case member 103 includes a connector housing space 106 and a case internal space 105 formed therein. A partition wall 114 is formed between the connector housing space 106 and the case internal space 105. The partition wall 114 includes an opening 114a through which the terminal forming regions 111 and 112 protrude. The terminal forming region 111 includes the terminals 92 and 93 formed therein. The terminal forming region 112 includes the terminals 97 and 98 formed therein. The opening 114a has the same tapered shape as the insulating resin member 101 so that the insulating resin member 101 is fitted in close contact with the opening 114a. A lid member 104 that seals a rear opening of the resin case member 103 includes a connector housing space 107 that constitutes a male connector. A wall part to be a lid of the lid member 104 includes an opening 104a formed therein. The insulating resin member 102 is fitted in close contact with the opening 104a. An insertion portion 109 is formed in order to obtain airtightness by pressing the insertion portion 109 into the opening of the resin case member 103. The insertion portion 109 includes a plurality of ring-shaped projections 109a formed therein in order to improve insertability and airtightness.

For assembly, the circuit board 91 is inserted from the rear opening of the resin case member 103. The circuit board 91 includes an electronic component mounted thereon and the insulating resin members 101 and 102. Although not shown in the figures, groove-shaped side surface guides are formed on side walls of the resin case member 103. Side surface portions of the board 91 protruding from the insulating resin members 101 and 102 are fitted to the groove-shaped side surface guides. The board 91 is fitted to the side surface guides and pushed until the insulating resin member 101 hits the opening 114a of the partition wall 114. Next, the lid member 104 is pressed to the opening of the resin case member 103 so as to protrude the terminal forming region 112 from the opening 104a. The terminal forming region 112 includes the terminals 97 and 98 formed therein. The lid member 104 is pushed harder until the insulating resin member 102 is locked in contact with the opening 114a of the partition wall 114 and the opening 104a of the lid member 104. In this state, a liquid adhesive is filled into a gap between a rear edge portion of the resin case member 103 and an outer stepped portion of the lid member 104. Then, the liquid adhesive is subjected to curing treatment.

According to the present embodiment, connecting terminals are disposed on the opposing sides of the circuit board and the connecting terminals on each side are arranged in two rows. Therefore, even when the electronic module has 100 to a few hundred connecting terminals, a desired number of terminals can be formed without widening the width of the board. As a result, a plane size of the electronic module can be reduced. Insertion of the board, push-in work of the lid member, and work of filling the gap between the outer case and the lid member with the adhesive are only required for the assembly of the electronic module. Therefore, the electronic module with excellent assemblability can be provided.

Fifth Embodiment

In the present embodiment, another exemplary terminal configuration of a circuit board will be described with reference to FIGS. 10A, 10B, and 10C.

Figure 10A:
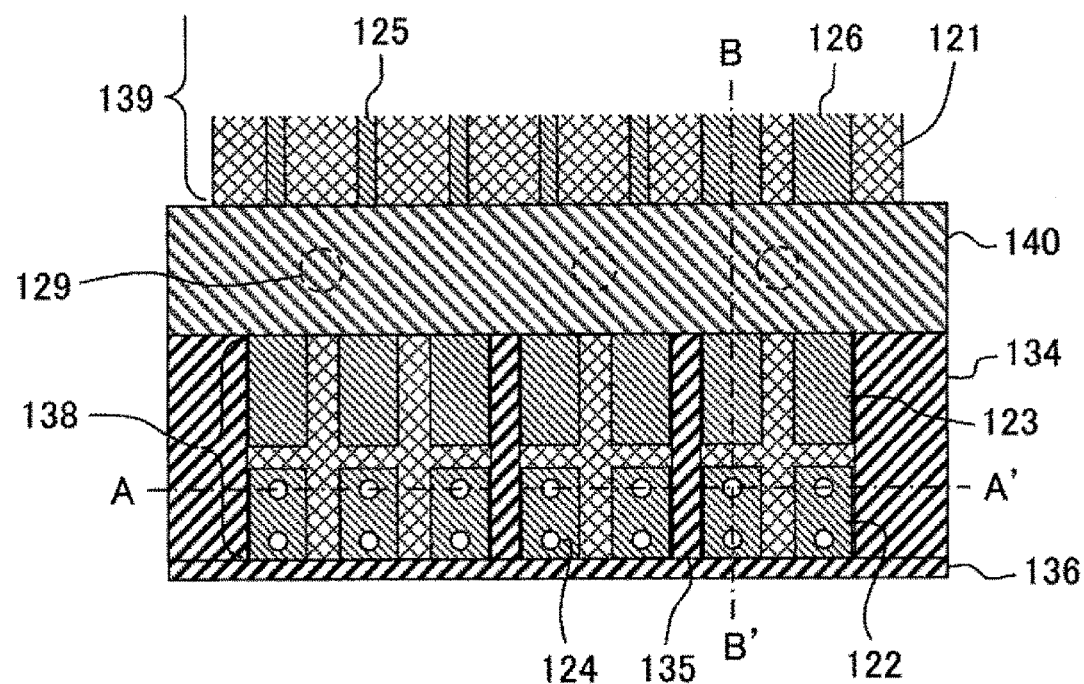
FIG. 10A is a top view of a configuration of a mounting board including a terminal forming region reinforced.
Figure 10B:
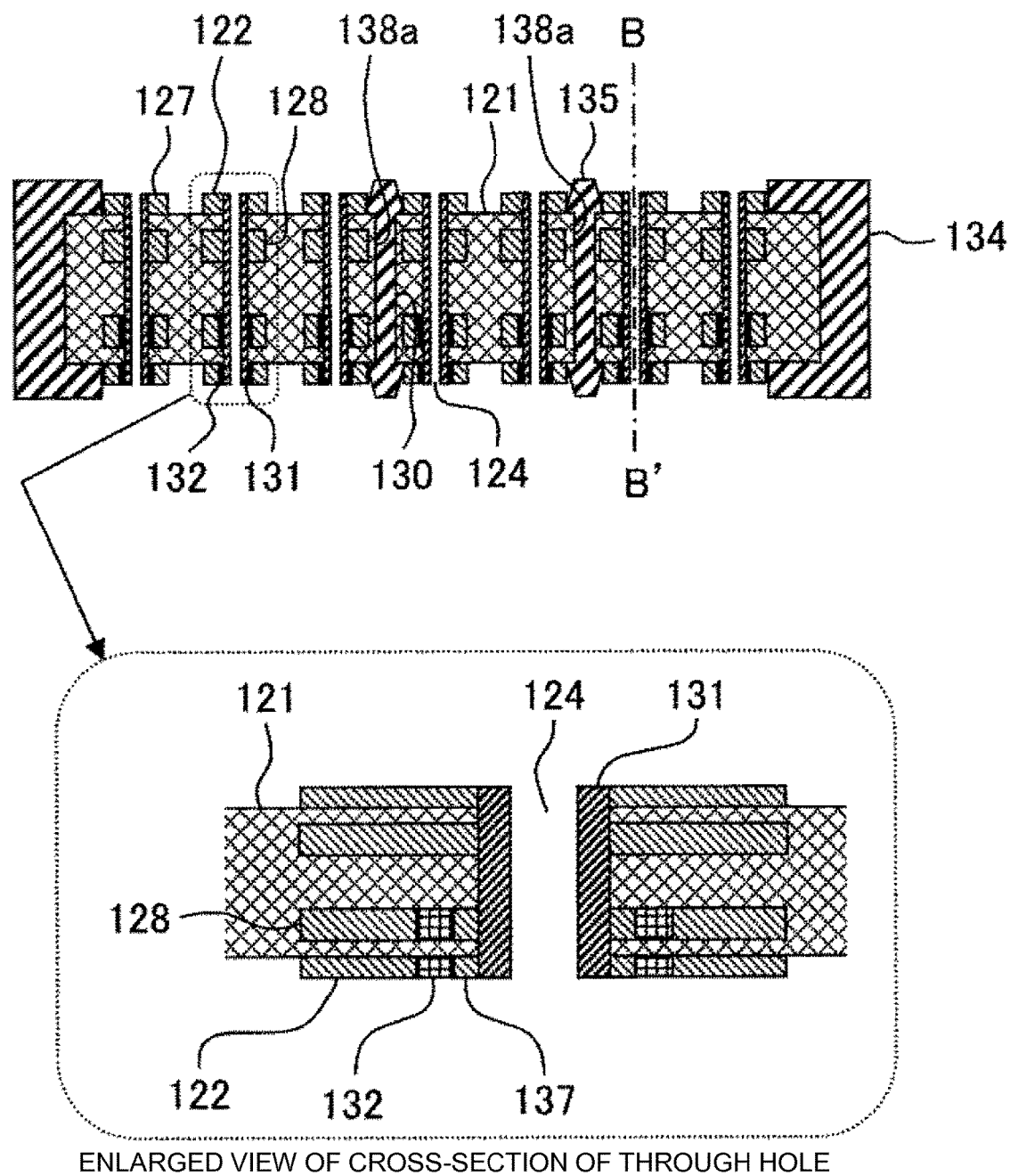
FIG. 10B is a cross-sectional view taken along line A-A' of FIG. 10A.
Figure 10C:
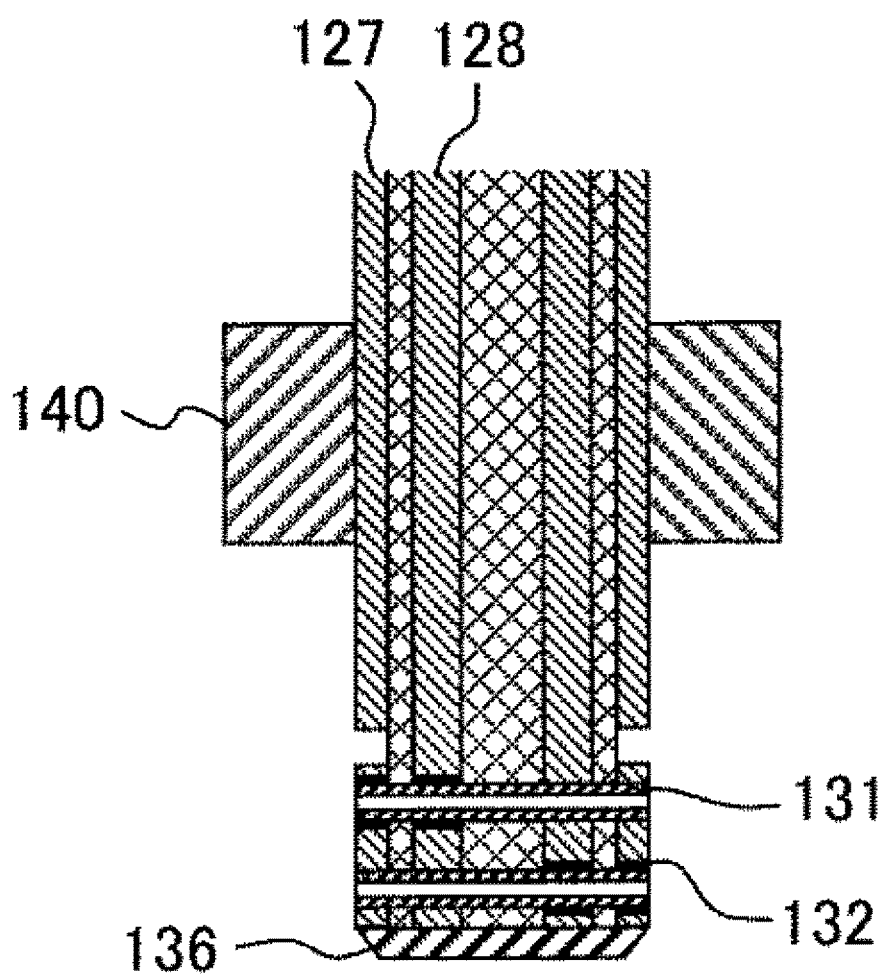
FIG. 10C is a cross-sectional view taken along line B-B' of FIG. 10A.

FIG. 10A is, in particular, a top view of a terminal forming region in a configuration of reinforcing a board end surface with a four-layered board including terminal arrangement in two rows. FIG. 10B is a cross-sectional view taken along line A-A' of FIG. 10A. FIG. 10C is a cross-sectional view taken along line B-B' of FIG. 10A. Note that a terminal configuration to be described in the present embodiment can be applied to the other embodiments described above.

In the figure, patterns of signal wiring 125 and power supply wiring 126 are formed in a mounting region 139 of a circuit board 121. An outer terminal 122 and an inner terminal 123 are formed in a terminal forming region 138. The outer terminal 122 is electrically coupled to inner wiring 128 through a Cu-plated film 131 formed in a through hole 124. Connection is electrically performed between two layers on one side in a four-layered wiring layer. In a wiring layer having electrically no connection, a land 137 that supports the Cu-plated film 131 of the through hole 124 is electrically blocked by a peripheral wiring region and an insulating layer 132. Note that the outer terminal 122 and the inner terminal 123 are formed on a surface of the circuit board 121, constituting surface wiring to the inner wiring 128.

An insulating resin member 140 is formed between the mounting region 139 and the terminal forming region 138 of the circuit board 121 so as to surround the board 121. The insulating resin member 140 fixes the circuit board 121 to a partition wall of a case member Through holes 129 are formed so as to avoid the wiring region in a plurality of parts in a board region covered with the insulating resin member 140. Thus, the insulating resin members 140 on both surfaces of the board are coupled to each other via the same resin.

A side surface protecting resin member 134 is formed in a board side surface portion of the terminal forming region 138 so as to interpose the board 121. A resin member 135 having a rivet-shaped cross-section is formed in a slit portion 138a formed from a board end surface to the insulating resin member 140. An end surface protecting member 136 is formed on the board end surface so as to cover four-layered wiring. The side surface protecting member 134, the rivet-shaped resin member 135, and the end surface protecting member 136 can be simultaneously formed by adjusting a metal die upon transfer molding of the insulating resin member 140 using a thermosetting resin. The end surface protecting member 136 and the side surface protecting member 134 can be attached to a mounting board by insertion or an adhesion method after the mounting board is completed. Note that, though not shown in the figures, a region in which a resin member is formed by transfer molding is flattened by resin coating and curing treatment in order to prevent a gap between a metal die and the circuit board.

According to the present embodiment, functions of the end surface and side surface protecting members, the rivet-shaped resin member, a Cu-plated film formed in the wiring layer and between the lands, can prevent delamination that easily occurs at the end surface. Accordingly, malfunction caused by repeating insertion and extraction of a client female connector can be prevented. Insulation failure or leakage failure caused by moisture that penetrates an interlayer due to long-term use can be prevented. Therefore, the electronic module with excellent reliability can be provided.

In order to prevent the delamination, the through hole 124 is preferably arranged to be close to an end portion of the circuit board 121. Board terminals are arranged in the end portion of the circuit board 121 in order to couple to the female connector. Accordingly, the through hole 124 is disposed within a range in which the board terminals are formed. In the present embodiment, the board terminals include the outer terminal 122 and the inner terminal 123 arranged in two rows. In this case, in order to arrange the through hole 124 close to the end portion of the circuit board 121, the through hole 124 is disposed within a range in which the outer terminal 122 is formed.

As described in each of the embodiments above, the present invention includes the following configurations.

An on-vehicle electronic module according to the present invention includes a mounting board and a case member. The mounting board includes an electronic component mounted on a circuit board. The case member houses the mounting board so as to protect the mounting board from a surrounding environment. A part of the circuit board is protruded from an opening disposed in the case member to the outside of the case member. A board terminal is inserted into an external female connector so as to obtain electrical conduction. A connector housing is formed so as to mount the female connector in a part of the case member and protect a space, in which the board terminal exists, from the surrounding environment. An insulating resin member that fixes the circuit board to a case and the circuit board are integrally formed by molding or joining and bonding.

That is, connection can be made by using the part of the case and the circuit board terminal without a conventional connecting metal pin and a conventional connector housing component made of a thermoplastic resin including polybutylene terephthalate (PBT), nylon, or polyphenylene sulfide (PPS). Therefore, reduction of manufacturing cost can be achieved due to reduction of the number of components and omission of a solder joint process of the circuit board and a connector pin. A height of an electronic module is likely to be high because a connector housing member is large in size for connection with a client-side female connector and is mounted on the circuit board. However, the height of the electronic module can be reduced to substantially the same thickness as a connector housing. In addition, with respect to a plane size, a connector member mounting region and a connector pin connecting region can be removed. Although a connecting region of the board terminals is still required, the connecting region is smaller than the sum of the connector member mounting region and the connector pin connecting region. Thus, the electronic module can be miniaturized and thinned. Furthermore, a heat process of the mounting board after the electronic component is mounted can be omitted. There is therefore no risk of degradation and damage caused by compound growth and thermal stress in a solder joint portion of the electronic component, or thermal damage of a peripheral member such as a capacitor. Thus, excellent yield and reliability can be expected.

In the on-vehicle electronic module described above, the insulating resin member is formed between a mounting region to be mounted with a component and a terminal forming region of the circuit board. The insulating resin member fixes the circuit board to the case member.

Between the terminal forming region and the mounting region, forming the insulating resin member for fixing the circuit board to the case member can support external force that is applied to the board terminal when the connector is mounted. There is no risk of deformation of the board caused by the external force of the mounting region of the board. Therefore, the reliability of the electronic module can be improved. Even when the board terminal is protruded from the opening of the case member to an exterior, hermetically bonding the insulating resin member formed over a full periphery of the circuit board and the case member can hermetically seal the inside of the case. Therefore, environment resistance can be improved.

The on-vehicle electronic module according to the present invention includes insulating resin members coupled to each other via an open hole of the circuit board.

The insulating resin members on both surfaces of the circuit board are integrally formed by forming the open hole. Thus, even when adhesive force between the insulating resin member and the circuit board is not strong enough, the insulating resin members on both surfaces of the board press the board by contraction force of the insulating resin member formed in the open hole. Therefore, there is no risk of detachment between the insulating resin member and the circuit board.

The case of the on-vehicle electronic module according to the present invention includes a resin member including a wall surface (front) having an opening from which the board terminal protrudes, and a resin member including an opposite wall surface (rear) to the front wall surface. Both of the resin members are airtightly and integrally formed.

Since the case member with the front wall surface and a member of the rear wall surface are separately constructed, the mounting board is inserted from a rear of the case so as to be fixed to the front wall surface and then the rear wall surface is fixed so as to hermetically seal the inside of the case. Thus, the electronic module is easily assembled.

The on-vehicle electronic module according to the present invention includes the insulating resin member bonded to a wall surface. The wall surface has an opening on a side in which the connector housing of the case member is formed.

The insulating resin member and the front wall surface are bonded to each other. Therefore, external force applied to the terminal forming region can be prevented from transmitting to the mounting region of the circuit board.

The on-vehicle electronic module according to the present invention includes a mounting board inside the case fixed and held by the insulating resin member and guides. The insulating resin member is formed on the circuit board. The guides are formed on both side walls of the case.

The mounting board inside the case is fixed and held by the insulating resin member and the guides. The guides are disposed on both sides of the board and have a length of at least half of the board inside the case. Therefore, even when vibration and impact are applied to the electronic module, movement of the board inside the case can be minimized. A bend of the board and high impact force caused by collision between the board and the case can be prevented. As a result, reliability of the electronic module with respect to a physical load can be improved.

The on-vehicle electronic module according to the present invention includes a through hole formed in a terminal region close to a board end surface in the terminal forming region of the circuit board in order to couple inner wiring and surface wiring. A side wall of the through hole is plated with Cu.

A rivet-shaped insulating resin is disposed between the board terminals in the terminal forming region of the circuit board. The rivet-shaped insulating resin is filled in a slit formed from the circuit board end surface, and has head portions wider than a slit width on both surfaces of the board.

Adjacent to the board end surface in the terminal forming region, an interlayer of the board is coupled with Cu plating inside the through hole and the rivet-shaped insulating resin interposes the board. Therefore, a risk of delamination in a multilayer board can be prevented. The electronic module having excellent repeating attachability and detachability of the connector can be provided. The on-vehicle electronic module resistant to insulation failure by moisture penetration into the interlayer can be provided.

Note that the present invention is not limited to each of the embodiments described above and may include various modifications. For example, the above embodiments have been described in detail in an easy-to-understand manner. The present invention is not necessarily limited to including all the configurations. A part of the configuration in one of the embodiments can be replaced with the configuration in another embodiment. In addition, the configuration in one embodiment can be added to the configuration in another embodiment. With respect to a part of the configuration in each of the embodiments, additions, deletions, and replacements of the other configurations may be made.

REFERENCE SIGNS LIST 1 circuit board
2 mounting region
3 terminal forming region
4 outer terminal
5 inner terminal
8, 9, 10, 11 electronic component
12 insulating resin member
13 resin case member
13a male connector housing
14 front partition wall
14a opening
15 Al die casting case member
16 lid
17 rear guide
18 heat conductive paste
19 adhesive
20 adhesive
21 case internal space
22 connector housing space
23 adhesive
31 terminal forming region
32 mounting region
33 circuit board
34 inner terminal
35 outer terminal
36 through hole
37 electronic component
38 insulating resin member
39 through hole
40 resin case member
41 partition wall
42 side surface guide
43 lid
46 case internal space
47 connector housing space
49 board holding auxiliary guide
50 groove
51 insulating board
52 inner wiring
53 surface wiring
54 circuit board
55 mounting region
56 terminal forming region
57 insulating resin member
58 through hole
59 resin case member
60 partition wall
60a opening
61 seal adhesive
62 insulating resin member
63 adhesive
64 insulating resin member
65 claw
66 escape space
71 circuit board
72 terminal forming region
73 outer terminal
74 inner terminal
75, 76 surface wiring
77 electronic component mounting region
78 flattened insulating resin layer
79 through hole
80 slit
81 insulating resin member
82 resin case member
83 partition wall
83a opening
84 inner wiring
91 circuit board
92, 97 outer terminal
93, 98 inner terminal
94, 99 through hole
100 mounting region
101, 102 insulating resin member
103 resin case member
104 lid member
105 case internal space
106 connector housing space
107 connector housing space
109 insertion portion
109a ring-shaped projection
110 electronic component
111, 112 terminal forming region
113 inner wiring
114 partition wall
114a opening
121 circuit board
122 outer terminal
123 inner terminal
124 through hole
125 signal wiring
126 power supply wiring
128 inner wiring
131 Cu-plated film
132 insulating layer
133 circuit board
134 side surface protecting member
135 resin member having rivet-shaped cross-section
136 end surface protecting member
137 land
138 terminal forming region
138a slit portion
139 mounting region
140 insulating resin member
150 male connector
200 female connector
201 female connector case

202 wire harness
203, 204 connector pin
205 projection

The invention claimed is:

1. An on-vehicle electronic module comprising:
   a circuit board including a mounting region and a terminal forming region, an electronic component being mounted in the mounting region, a board terminal being formed in the terminal forming region; and
   a case housing the mounting region of the circuit board,
   wherein the case includes a case member integrally formed with a wall surface and a male connector housing, the wall surface forming a case internal space that houses the mounting region, a female connector being mounted to the male connector housing,
   the circuit board penetrates the case member such that the terminal forming region is exposed to a housing space side of the male connector housing,
   the circuit board integrally includes, between the mounting region and the terminal forming region, an insulating resin member that is integrally fixed to the circuit board and fixes the circuit board to the case member,
   the case member is integrally formed with the wall surface and the male connector housing, the wall surface forming the case internal space that houses the mounting region, the female connector being mounted to the male connector housing,
   the case member includes a partition wall that separates the case internal space and a housing space of the male connector housing from each other, and the insulating resin member is fixed to the partition wall;
   wherein a slit is formed between board terminals in the terminal forming region from an end surface of the circuit board, and
   a rivet-shaped insulating resin is disposed while filling the slit, the rivet-shaped insulating resin including a head portion wider than a slit width on each of both surfaces of the circuit board.

2. The on-vehicle electronic module according to claim 1,
   wherein the case member includes a resin member having an opposite surface of the partition wall open, and
   the case includes the case member and a resin lid member, the resin lid member being mounted on an open surface of the case member facing the partition wall.

3. The on-vehicle electronic module according to claim 1,
   wherein the insulating resin member is disposed on each of both surfaces of the circuit board, and the insulating resin members formed on both surfaces of the circuit board are coupled to each other via an open hole formed in the circuit board.

4. The on-vehicle electronic module according to claim 1,
   wherein the case member includes a guide, which holds the circuit board, on each of both side walls positioned in a direction orthogonal to a direction in which the circuit board penetrates the case member, and both side end portions of the circuit board are held by the guides.

5. The on-vehicle electronic module according to claim 1,
   wherein a through hole is formed in the terminal forming region in order to couple inner wiring and surface wiring, and a side wall of the through hole is plated with Cu.

6. The on-vehicle electronic module according to claim 1,
   wherein the insulating resin member fixes the circuit board to the case member via an adhesive.

* * * * *